US011460680B2

(12) United States Patent
O'Brien

(10) Patent No.: US 11,460,680 B2
(45) Date of Patent: Oct. 4, 2022

(54) PHOTONIC SUBSYSTEM

(71) Applicant: University College Cork—National University of Ireland, Cork, Cork (IE)

(72) Inventor: Peter O'Brien, Cork (IE)

(73) Assignee: University College Cork-National University of Ireland, Cork, Cork (IE)

( * ) Notice: Subject to any disclaimer, the term of this patent is extended or adjusted under 35 U.S.C. 154(b) by 208 days.

(21) Appl. No.: 16/833,425

(22) Filed: Mar. 27, 2020

(65) Prior Publication Data
US 2020/0310142 A1    Oct. 1, 2020

(30) Foreign Application Priority Data

Mar. 28, 2019  (GB) ........................ 1904323

(51) Int. Cl.
| | | |
|---|---|---|
| *G02B 19/00* | (2006.01) | |
| *G02B 27/09* | (2006.01) | |
| *G02B 3/04* | (2006.01) | |
| *H01S 5/02234* | (2021.01) | |
| *H01S 5/02255* | (2021.01) | |
| *H01S 5/00* | (2006.01) | |

(52) U.S. Cl.
CPC .......... *G02B 19/0052* (2013.01); *G02B 3/04* (2013.01); *G02B 27/0955* (2013.01); *H01S 5/02234* (2021.01); *H01S 5/02255* (2021.01); *H01S 5/005* (2013.01)

(58) Field of Classification Search
CPC . G02B 19/0052; G02B 27/09; H01S 5/02255; H01S 5/02234; H01S 5/022; H01S 5/0225
USPC ........................................................ 372/100
See application file for complete search history.

(56) References Cited

U.S. PATENT DOCUMENTS

| | | | |
|---|---|---|---|
| 9,971,107 B2* | 5/2018 | Mekis | G02B 6/4213 |
| 10,162,135 B2* | 12/2018 | Gamache | G02B 6/4208 |
| 2004/0264856 A1* | 12/2004 | Farr | G02B 6/4206 |
| | | | 385/33 |

* cited by examiner

Primary Examiner — Tuan N Nguyen
(74) Attorney, Agent, or Firm — Arc IP Law, PC; Joseph J. Mayo

(57) ABSTRACT

At least one embodiment of the invention provides a photonic subsystem for integrating onto a photonic platform. The subsystem comprises a laser source and a plurality of optical components for focusing and directing a laser beam emitted from the laser source into a photonic platform. The laser source and plurality of optical components are mounted to a substrate and encapsulated.

13 Claims, 9 Drawing Sheets
(9 of 9 Drawing Sheet(s) Filed in Color)

PHOTONIC SUBSYSTEM

The application claims the benefit of United Kingdom Patent Application No. 1904323.1, filed 28 Mar. 2019, the specification of which is hereby incorporated herein by reference.

BACKGROUND OF THE INVENTION

Field of the Invention

At least one embodiment of the invention relates to photonic technology, and more particularly with a photonic subsystem for integrating onto a photonic platform.

Description of Related Art

Advances in integrated circuit technology in recent years have led to significant developments in the field of photonics. A typical photonic platform such as a silicon photonic device provides passive photonic functions, as well as optical modulation and optical detection. Thus, the photonic device may comprise a grating-coupler and a waveguide, but does not include an intrinsic optical source. Accordingly, a separate laser diode must be integrated into the photonic device as a photonic subsystem in order to provide the required optical source. This attachment process is commonly referred to as hybrid integration.

A photonic subsystem for integration into a photonic platform is often known as a micro optical bench (MOB) or a Micro Optical Subsystem. A typical photonic subsystem or MOB comprises a laser source and focusing and beam directing optics for directing the laser beam into the grating coupler on the photonic device.

In order to protect the laser source on the photonic subsystem from the harsh environment so as to achieve reliable and long-term operation, the photonic subsystem must be sealed. One current technique used to seal a photonic subsystem is a hermetic sealing process. This involves enclosing the laser and micro optics in a vacuum or in an inert gaseous environment, and placing a lid over the subsystem. One example of a subsystem sealed using such a process has been developed by the company Luxtera. In this subsystem, the laser and micro optics are sealed in a silicon hermetic cavity. As this requires the implementation of additional Si wafer processing steps, namely the preparation of the silicon cavity and the sealing of the laser and the micro optics in the cavity, it adds significant cost to the packaging process. Furthermore, this process is complex, slow and difficult.

Accordingly, it is an object of at least one embodiment of the invention to overcome at least one of the above mentioned problems with current MOBs.

BRIEF SUMMARY OF THE INVENTION

According to the invention, there is provided, as set out in the appended claims, a photonic subsystem for integrating onto a photonic platform, the subsystem comprising:
a laser source;
a plurality of optical components for focusing and directing a laser beam emitted from the laser source into a photonic platform;
wherein the laser source and optical components are mounted to a substrate and encapsulated, and wherein at least one optical component is fabricated from a material having a refractive index value that is higher than the refractive index value of the encapsulant.

In one embodiment, the encapsulant comprises silicone.

In one embodiment, the silicone comprises Dow Corning Sylgard 184.

In one embodiment, the difference between the refractive index value of the at least one optical component and the refractive index of the encapsulant is greater than or equal to 1.5.

In one embodiment, the plurality of optical components comprise at least one micro-lens for focusing the laser beam and a micro-prism for directing the focused laser beam into a photonic platform into which the photonic system is to be integrated.

In one embodiment, the at least one micro-lens comprises a silicon micro-lens.

In one embodiment, the silicon micro-lens is configured to have a radius of curvature of 390 μm.

In one embodiment, the silicon micro-lens is configured to produce a laser spot beam having a major axis of 22.9 μm and a minor axes of 7.6 μm when the distance L2 between the bottom of the micro-prism and a photonic platform into which the photonic system is to be integrated is 250 μm.

In one embodiment, the silicon micro-lens comprises an aspherical lens configured to have a radius of curvature of 700 μm.

In one embodiment, the silicon micro-lens is configured to produce a laser spot beam having a major axis of 26.8 μm and a minor axis of 9.7 μm when the distance L2 between the bottom of the micro-prism and a photonic platform into which the photonic system is to be integrated is 250 μm.

In one embodiment, the at least one micro-lens comprises a micro-ball lens fabricated from a high-index glass.

In one embodiment, the plurality of optical components comprises two micro-ball lenses and a micro-prism.

In one embodiment, the high-index glass comprises a glass having a refractive index of 1.9743 when the wavelength of the laser source is 1550 nm.

In one embodiment, the high-index glass lens is adapted to have a radius of curvature of 150 μm.

In one embodiment, the high-index glass lens is configured to produce a laser spot beam having a major axis of 30.5 μm and a minor axes of 10.7 μm when the distance L2 between the bottom of the micro-prism and a photonic platform into which the photonic system is to be integrated is 250 μm.

In one embodiment, the high-index glass lens is configured to produce a laser spot beam having a major axis of 22.1 μm and a minor axes of 8.2 μm when the distance L2 between the bottom of the micro-prism and a photonic platform into which the photonic system is to be integrated is 125 μm.

In one embodiment, the micro-prism comprises a turing prism.

In one embodiment, the substrate comprises a ceramic substrate.

In one embodiment, the entire photonic subsystem is encapsulated.

In one embodiment, the wavelength of the laser source is in the range of 350 nm to 2000 nm.

In another embodiment of the invention there is provided a hybrid integrated photonic system comprising:
a photonic device; and
the photonic subsystem, where the photonic subsystem is integrated into the device.

In one embodiment, the photonic device comprises a coupler grating designed to match the dimensions of the laser spot it receives from the photonic subsystem.

In one embodiment, the photonic device comprises one or a silicon, ceramic, organic printed circuit board or glass base device.

In another embodiment of the invention, there is provided a photonic subsystem for integrating onto a photonic platform, the subsystem comprising:
  a laser source;
  a plurality of optical components for focusing and directing a laser beam emitted from the laser source into a photonic platform;
  wherein the laser source and optical components are mounted to a substrate and encapsulated.

In another embodiment of the invention there is provided a method for fabricating a photonic subsystem for integrating onto a photonic platform, the method comprising:
  providing a laser source;
  providing a plurality of optical components;
  mounting the laser source and the optical components to a substrate; and encapsulating the laser source and the optical components, wherein at least one optical component is fabricated from a material having a refractive index value that is higher than the refractive index value of the encapsulant.

In another embodiment of the invention there is provided a method for fabricating a photonic subsystem for integrating onto a photonic platform, the method comprising:
  providing a laser source;
  providing a plurality of optical components;
  mounting the laser source and the optical components to a substrate; and
  encapsulating the laser source and the optical components.

In one embodiment, the step of encapsulating comprises pouring silicone over the laser source and the optical components.

In one embodiment, the method further comprises encapsulating the entire photonic subsystem.

In one embodiment, the method further comprises pouring the silicone when it has a viscosity in the range of 5,000 to 50,000 CPS.

In one embodiment, the plurality of optical components comprise at least one micro-lens and a micro-prism.

BRIEF DESCRIPTION OF THE DRAWINGS

The patent or application file contains at least one drawing executed in color. Copies of this patent or patent application publication with color drawing(s) will be provided by the Office upon request and payment of the necessary fee. The invention will be more clearly understood from the following description of an embodiment thereof, given by way of example only, with reference to the accompanying drawings, in which:

FIG. 9b shows the coupling efficiency spectrum of the optimised grating coupler of FIG. 9a.

DETAILED DESCRIPTION OF THE DRAWINGS

Figure 1:
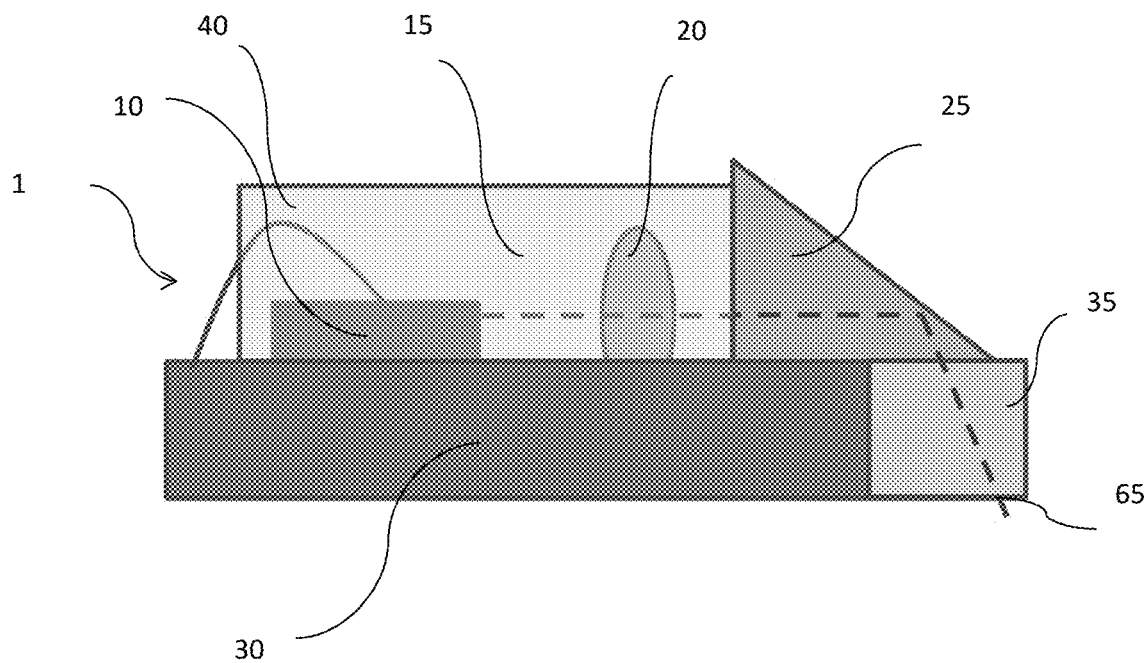
FIG. 1 shows one embodiment of the photonic subsystem of an embodiment of the invention.
Figure 2:
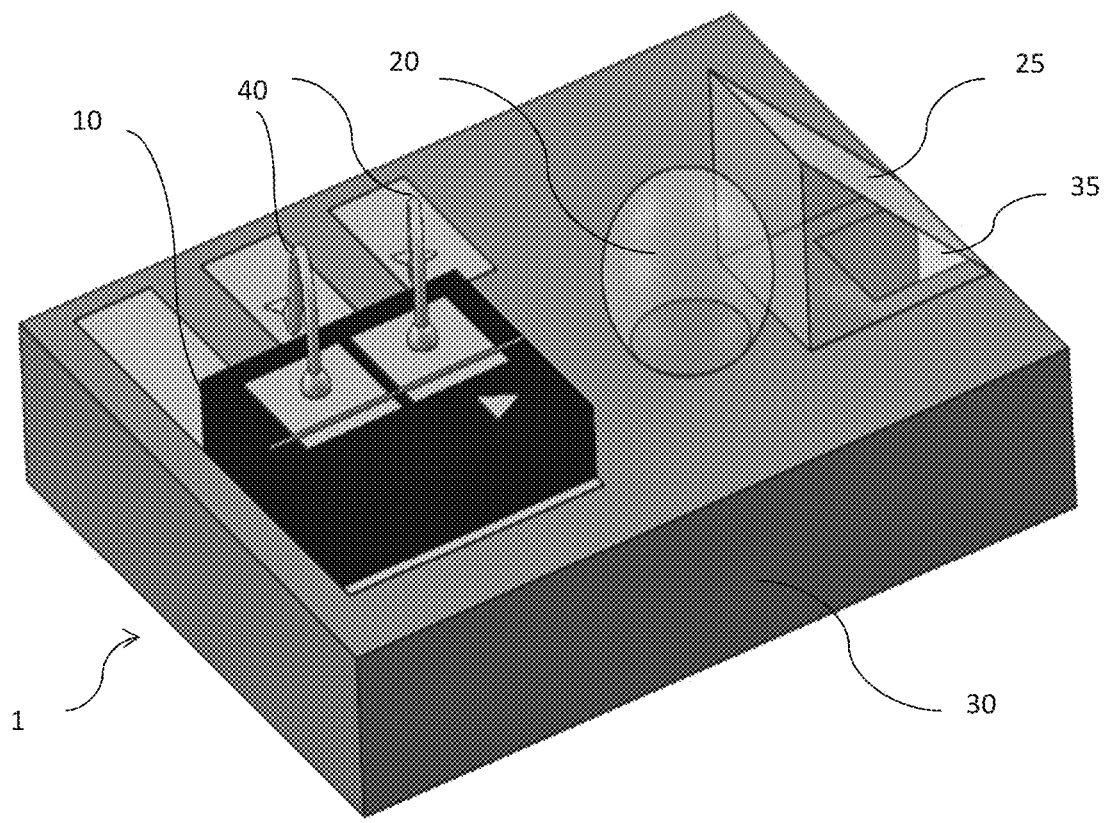
FIG. 2 shows a 3D schematic of the photonic subsystem of FIG. 1.

At least one embodiment of the invention provides a photonic subsystem for integration into a photonic platform. As shown in FIGS. 1 and 2, the photonic subsystem 1 of the invention comprises a laser source 10 and a plurality of optical components. The laser source and optical components are mounted to a ceramic substrate 30 and encapsulated. The optical components comprise a micro-lens 20 and a micro-prism, which in the embodiment shown takes the form of a turing prism 25. The facet of the prism 25 is coated with metal to act as a reflector. The laser source 10 is attached to the substrate 30 by means of electrical wirebonds 40.

Figure 3:
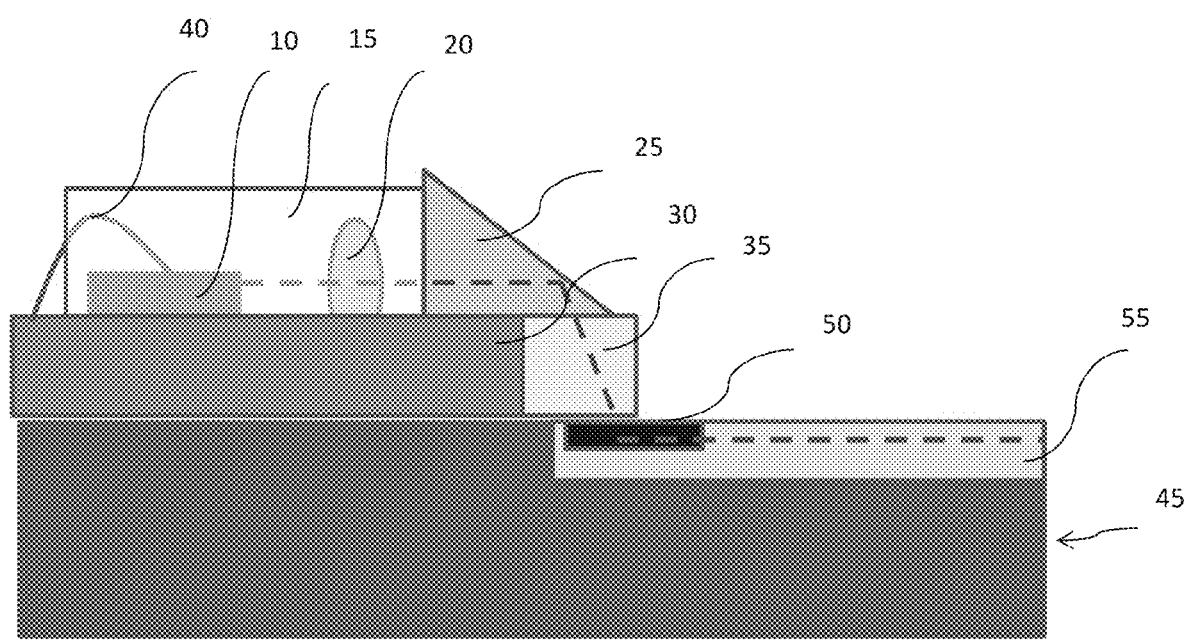
FIG. 3 shows the photonic subsystem of FIG. 1 integrated onto a silicon photonic device.

FIG. 3 shows an exemplary embodiment where the photonic platform onto which the photonic subsystem 1 of the invention is integrated comprises a silicon photonic device 45. The silicon photonic device 45 comprises a waveguide 55 and a waveguide grating-coupler 50. The waveguide grating-coupler 50 is adapted to couple the laser beam from the laser source 10 on the photonic subsystem 1 to the waveguide 55. An optical via 35 provided on the substrate 30 enables the reimaged laser spot to be coupled into the grating coupler 50.

The photonic subsystem 1 is encapsulated so as to protect the laser 10 and the optical components from the environment. In particular, the encapsulant is to protect the photonic subsystem from environmental conditions that will impact on the reliability of the subsystem, such as for example humidity. In one embodiment of the invention, the encapsulant comprises clear silicone, such as for example Dow Corning Sylgard 184.

The encapsulation process is performed during fabrication of the photonic subsystem 1 by pouring silicone 15 over the photonic sub-system 1. The silicone 15 is poured after the laser 10 and optical components have been assembled onto the substrate 30 and in such a manner as to ensure that the silicone 15 covers all parts of the photonic subsystem 1 that are in the optical path of the laser 10. In the described embodiment of the invention, the silicone 15 is poured over the entire photonic subsystem 1. In an alternative embodiment of the invention, the silicone may only be poured over the laser 10 and the optical components of the photonic subsystem 1. However, in all embodiments of the invention the silicone must be poured so as to cover at least all of the components of the photonic sub-system that are affected by the environment. The pouring is preferable performed when the silicone has a reasonably high viscosity, such as for example a viscosity in the range of 5,000 to 50,000 Centipoise (CPS), and preferably 10,000 CPS.

Due to the encapsulation of the photonic subsystem 1 in an encapsulant such as silicone, it will be appreciated that the background refractive index of the subsystem 1 is increased. For example, the refractive index of silicone is n=1.5. Therefore, if a standard lens were to be used in the photonic subsystem of the invention such as those fabricated from standard glass, and an encapsulant such as silicone epoxy poured over the lens, the optical performance of the photonic sub-system would be lost. This is because the refractive index of standard glass is 1.5, and therefore there would be no refractive index difference between the lens and its silicone environment. Thus, the at least one embodiment of the invention uses a lens which has a refractive index higher than standard glass, and thus when encapsulated, is able to provide an optical performance which almost matches the optical performance of glass with respect to air. The difference between the refractive index value of the material of the lens and the refractive index value of the encapsulant should be as large as possible for optimal optical performance. In one embodiment of the invention, a difference of 1.5 between the refractive index of the encapsulant and the refractive index of the lens provides good optical performance.

Accordingly, it is necessary that the micro-optic lens 20 has a refractive index which is of a high enough value that it is not transparent when encapsulated in silicone, as well as that which can deliver a laser-spot beam profile suitable for coupling to the grating-coupler 50 of the photonic device 45. Such a laser-spot beam would be a laser-spot beam small enough to enable efficient optical power transfer to the grating coupler 50.

Figure 6A:
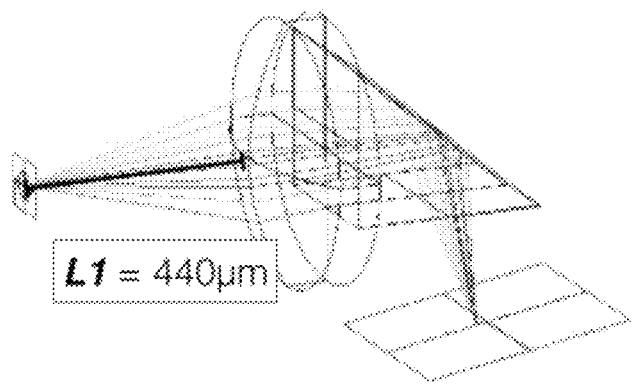
FIGS. 6a and 6b show a simulation of the photonic subsystem of FIG. 1 with a custom made micro-lens with a RoC of 390 µm, along with a simulation of the smallest spot possible with this lens with L2=250 µm.
Figure 6B:
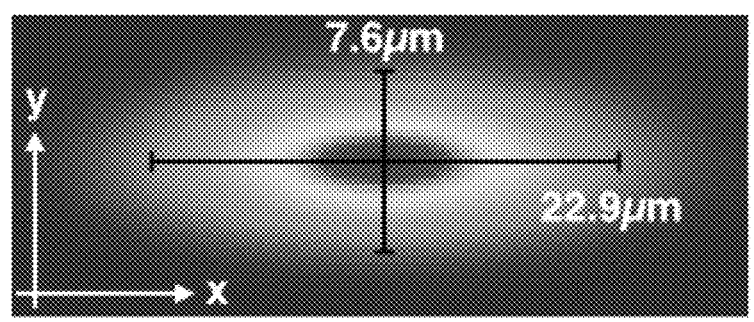

One suitable material for a high index micro-lens 20 is silicon, as silicon has a refractive index n of 3.4777 @ 1550 nm. This will result in a difference between the refractive index of the silicone encapsulant and the refractive index of the silicon lens of around 1.5. In one embodiment of the invention, the micro-lens 20 comprises a custom made silicon lens configured to have an optimised lens profile and cross-section. With a custom made silicon micro-lens with a radius of curvature (RoC) of 390 µm, the smallest laser spot beam which the photonic subsystem 1 can provide is a laser spot beam having a major axis of 22.9 µm and a minor axes of 7.6 µm when the distance L2 between the bottom of the prism 25 and the photonic device 45 is 250 µm (which distance is equal to the thickness of the substrate 30). FIGS. 6a and 6b shows a simulation of the photonic subsystem 1 with this custom made micro-lens, along with a simulation of the smallest spot possible with this lens with L2=250 µm.

Figure 5A:
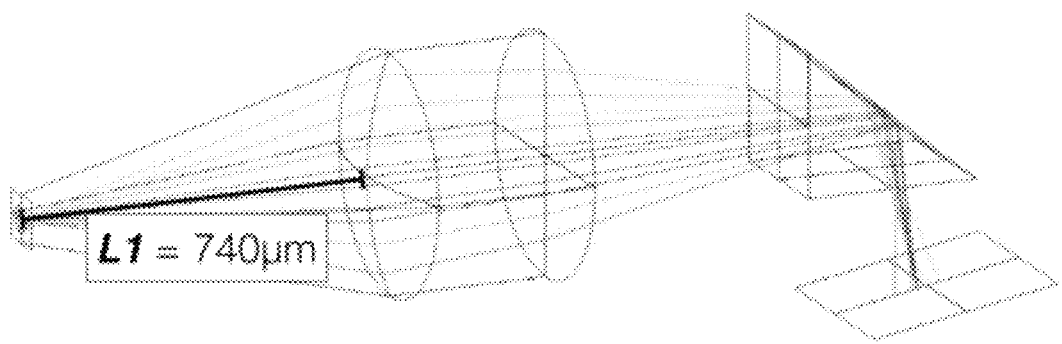
FIGS. 5a and 5b show a simulation of the photonic subsystem of FIG. 1 when the micro-lens comprises a LDC 500 Si micro-lens with a RoC of 700 µm, along with a simulation of the smallest spot possible with this lens with L2=250 µm.
Figure 5B:
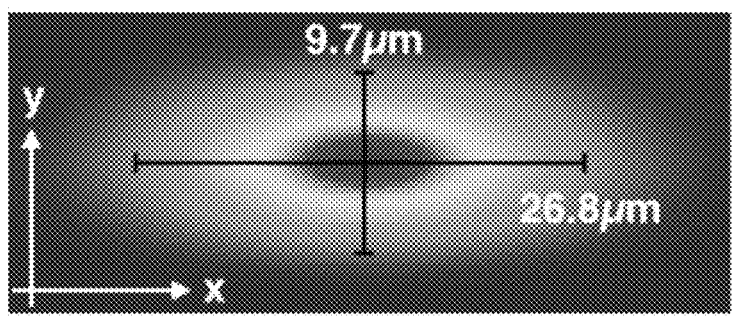

In an alternative embodiment of the invention, the micro-lens 20 comprises a commercial silicon micro-lens. One such suitable silicon micro-lens is the commercially available aspherical LDC 500 Si micro-lens manufactured by Axetris with a radius of curvature of 700 µm. With this commercial lens, the smallest laser spot beam which the photonic subsystem 1 can provide is an elliptical laser beam spot having a major axis of 26.8 µm and a minor axis of 9.7 µm when the distance between the bottom of the prism 25 and the photonic device 45 is 250 µm. FIGS. 5a and 5b show a simulation of the photonic subsystem 1 when the micro-lens comprises this LDC 500 Si micro-lens, along with a simulation of the smallest spot possible with this lens with L2=250 µm.

In yet another alternative embodiment of the invention, the micro-lens 20 comprises a lens fabricated from a high-index glass. This high-index glass may comprise for example LASF35, which has a refractive index n of 1.9743 @ 1550 nm, or LASFN9. In some embodiments of the invention, two high-index glass lenses can be provided in the photonic sub-system to achieve a total refractive index value sufficient to provide the desired focussing power.

With a LASF35 micro-ball lens with a radius of curvature of 150 µm, the smallest laser spot beam which the photonic subsystem 1 can provide is a laser beam spot having a major axis of 30.5 µm and a minor axis of 10.7 µm when the distance L2 between the bottom of the prism 25 and the photonic device 45 is 250 µm. Furthermore, if the distance between the bottom of the prism 25 and the photonic device 45 is decreased to 125 µm, the photonic subsystem 1 can provide an even smaller laser beam spot having a major axis of 22.1 µm and a minor axis of 8.2 µm with this LASF35 lens. The decrease in the distance L2 may be achieved through the use of a thinner substrate 30.

Figure 7A:
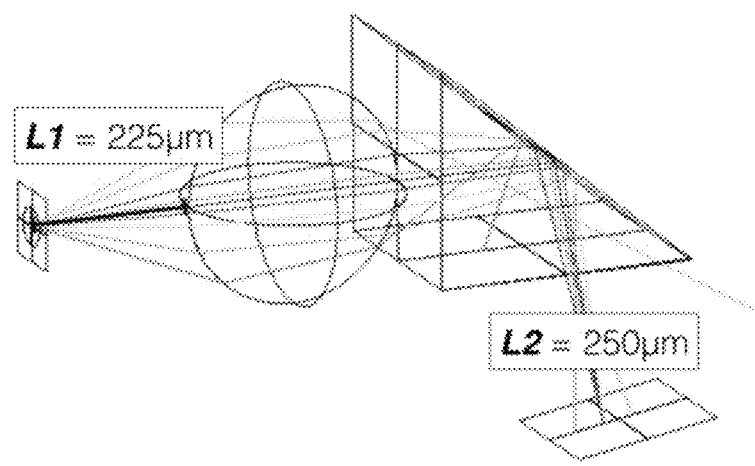
FIGS. 7a and 7b show a simulation of the photonic subsystem of FIG. 1 when the micro-lens comprises a LASF35 lens with a RoC of 150 µm, along with a simulation of the smallest spot possible with this lens with L2=250 µm.
Figure 7B:
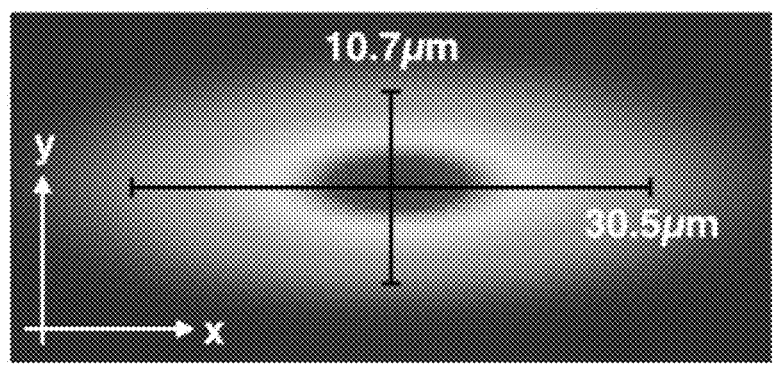
Figure 8A:
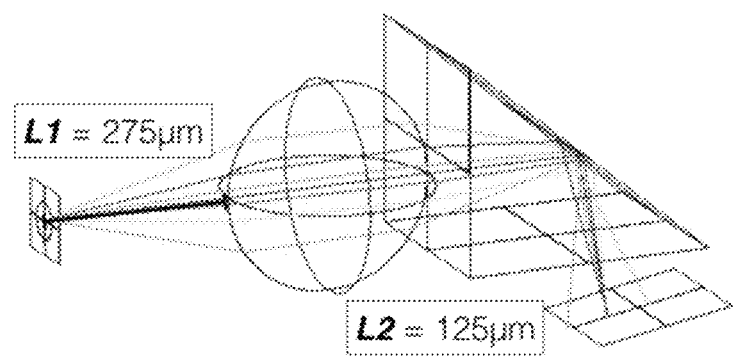
FIGS. 8a and 8b show a simulation of the photonic subsystem of FIG. 1 when the micro-lens comprises a LASF35 lens with a RoC of 150 µm, along with a simulation of the smallest spot possible with this lens with L2=125 µm.
Figure 8B:
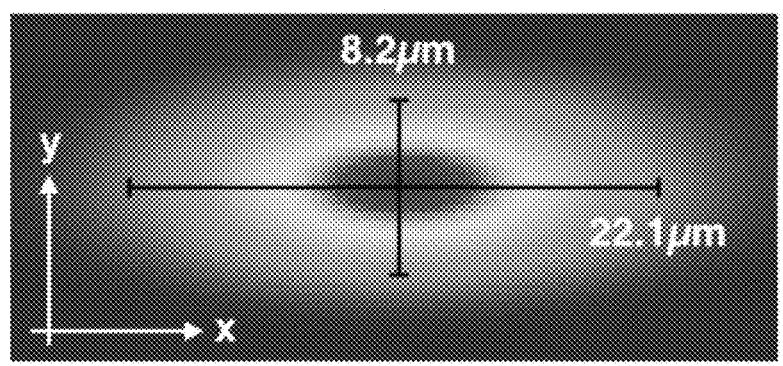

FIGS. 7a and 7b show a simulation of the photonic subsystem 1 when the micro-lens comprises this LASF35 lens, along with a simulation of the smallest spot possible with this lens with L2=250 µm, while FIGS. 8a and 8b show a simulation of the photonic subsystem 1 when the micro-lens comprises this LASF35 lens, along with a simulation of the smallest spot possible with this lens with L2=125 µm.

In some embodiments of the invention, the micro-prism is also fabricated with a material having a refractive index value that is higher than the refractive index value of the encapsulant. However, this is not necessary, as the coating on the prism is sufficient to provide the required deflection.

In one embodiment of the invention, the working range of the laser 10 of the photonic subsystem 1 is between 350 nm and 2000 nm, due to the fact that silicon may absorb an optical beam below 350 nm. For wavelengths lower than 1200 nm, the micro-lens 20 should be fabricated from high-index glass, as a silicon micro-lens would not be transparent for wavelengths below 1200 nm.

Figure 4:
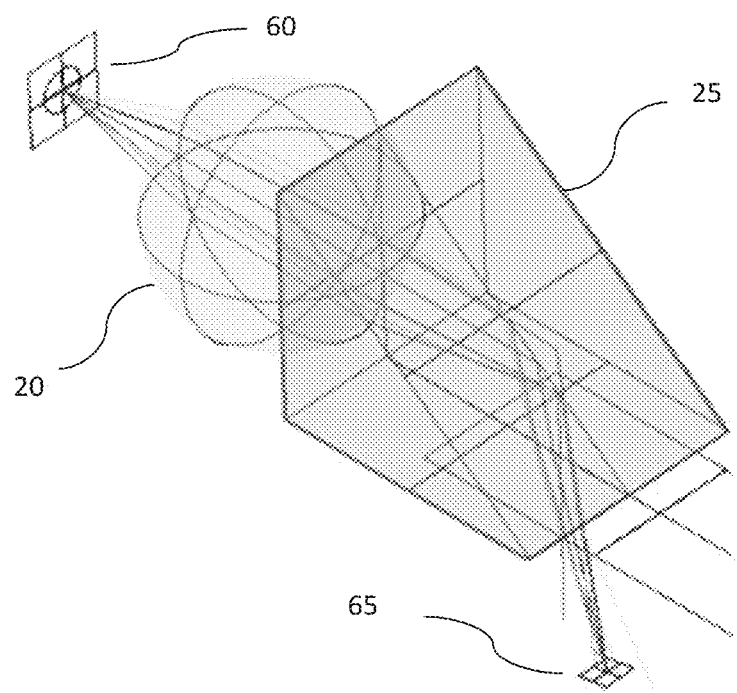
FIG. 4 shows an optical model of the optical path of the laser for the arrangement of FIG. 3.

In use, the micro-lens 20 of the photonic subsystem 1 focuses the laser beam emitted from the laser source 10, while the turing prism 25 directs the reimaged (refocused) laser beam downwards out of the plane to the grating-coupler 50 on the photonic device 45. This optical path of the laser light is shown with a dotted line in FIGS. 1 and 3. FIG. 4 shows a Zemax optical model of the optical path from the laser emission point 60 at the facet of the laser 10 to the point at which the re-imaged laser spot 65 enters the grating coupler 50 on the photonic device 45. It can be seen from this figure that the re-imaged laser spot is focused exactly at the waveguide grating coupler 50, in order to maximize coupling efficiency.

When at least one embodiment of the invention is being integrated with a photonic platform such as the photonic device 45 described above, one of the design considerations is to reduce the coupling penalty between the photonic subsystem 1 and the photonic device 45. A typical overlap between a focused laser beam spot emitted from the photonic subsystem 1 and the grating-coupler 50 on the photonic device 45 if the grating-coupler had the footprint of a standard grating-coupler (10 um×15 um) would be 70%. Thus, in order to reduce the coupling penalty experienced by the photonic device 45 coupled to the photonic subsystem 1, the grating coupler 50 of the photonic device 45 can be configured to match the elliptical beam profile of the laser spot emitted from the photonic subsystem 1. This is achieved by designing the grating-coupler 50 such that it matches the dimensions of the laser spot which it receives from the photonic subsystem 1 (known as the "re-imaged laser near-field"). In one embodiment, the laser spot size is derived from the Zemax model which simulates the optical beam of the laser 10 as it propagates thorough the photonic subsystem 1. For example, the grating-coupler 50 on the photonic device 45 may be optimised for free-space coupling to an elliptical laser spot on the photonic subsystem 1 with a major axis of 20 µm and a minor axis of 12 µm. It will be appreciated that this will result in the grating-coupler having a larger footprint than the standard footprint of a grating-coupler.

Figure 9A:
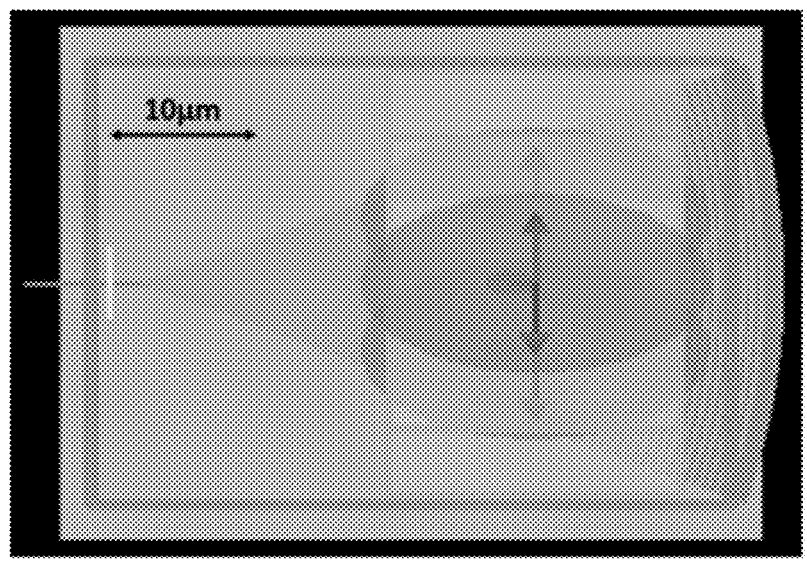
FIG. 9a shows a simulation of an exemplary optimised grating coupler on a photonic device onto which embodiments of the photonic subsystem may be integrated.
Figure 9B:
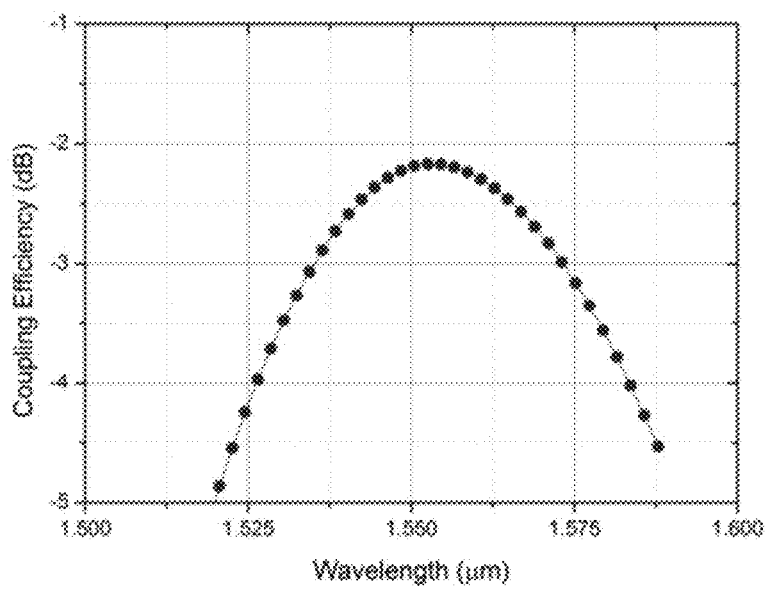

FIG. 9a shows a simulation of such an optimised grating coupler for use with an embodiment of the photonic subsystem 1. It can be seen that the simulated MOB-to PIC coupling efficiency using this exemplary optimised coupler is −2.2 dB. FIG. 9b shows the coupling efficiency spectrum of this design.

It should be noted that while the photonic subsystem of the invention has been described above for integration onto a pure silicon photonic platform, the photonic subsystem of the invention could equally well be used for integration onto any silicon based photonic platform, such as for example Silicon Nitride ($Si_3N_4$). Furthermore, it should be appreciated that the photonic subsystem of the invention could equally well be integrated into any suitable photonic platform, and not just onto the photonic device 45 described above. For example, the photonic platform could comprise a ceramic (such as AlN), an organic printed circuit board or a glass base.

At least one embodiment of the photonic subsystem provides numerous advantages over conventional photonic subsystems adapted for integration into a photonic platform. Firstly, the photonic subsystem provides a photonic substructure which has high reliability and high temperature stability. In addition, as silicone can withstand very high temperatures, the silicone encapsulation will not be affected if the subsystem were to be assembled onto a printed circuit board (PCB) through the use of a solder reflow process (such as for example when building a full telecom system).

Furthermore, due to the fact that the process technique to fabricate the photonic subsystem of the invention is far simpler than the conventional processing technique for fabricating photonic subsystems, the invention provides a low-cost photonic subsystem. In addition, the packaging costs are reduced. Accordingly, at least one embodiment of the the photonic subsystem is ideally suited to very large volume manufacturing.

In addition, simulations have shown that the fact that at least one embodiment of the photonic subsystem is encapsulated in silicone does not have any negative effect on the lifetime or the performance of the laser. Simulations have also shown that the optical performance of the photonic subsystem of the invention is similar to the optical performance of conventional photonic subsystems.

At least one embodiment of the invention can be used in a wide variety of applications. These include for example applications in the telecommunications, data communications, sensor and biomedical sectors.

In the specification the terms "comprise, comprises, comprised and comprising" or any variation thereof and the terms include, includes, included and including" or any variation thereof are considered to be totally interchangeable and they should all be afforded the widest possible interpretation and vice versa.

The invention is not limited to the embodiments hereinbefore described but may be varied in both construction and detail.

What is claimed is:

1. A photonic subsystem for integrating onto a photonic platform, the photonic subsystem comprising:
   a laser source;
   a plurality of optical components that focus and direct a laser beam emitted from the laser source into a photonic platform;
   wherein the laser source and the plurality of optical components are mounted to a substrate and encapsulated via an encapsulant, and wherein at least one optical component of the plurality of optical components is fabricated from a material having a refractive index value that is higher than the refractive index value of the encapsulant;
   wherein the plurality of optical components comprise at least one micro-lens that focuses the laser beam and a micro-prism that directs the laser beam that is focused into the photonic platform into which the photonic subsystem is to be integrated;
   wherein the at least one micro-lens comprises a silicon micro-lens;
   wherein the silicon micro-lens is configured to have a radius of curvature of 390 µm;
   wherein the silicon micro-lens is configured to produce a laser spot beam having a major axis of 22.9 µm and a minor axes of 7.6 µm when a distance L2 between a bottom of the micro-prism and the photonic platform into which the photonic subsystem is to be integrated is 250 µm.

2. The photonic subsystem of claim 1, where the encapsulant comprises silicone.

3. The photonic subsystem of claim 1, wherein difference between the refractive index value of the at least one optical component and the refractive index value of the encapsulant is greater than or equal to 1.5.

4. The photonic subsystem of claim 1, wherein a wavelength of the laser source is in a range of 350 nm to 2000 nm.

5. A hybrid integrated photonic system comprising:
   a photonic device; and
   a photonic subsystem that is integrated into the photonic device, wherein the photonic subsystem comprises
   a laser source;
   a plurality of optical components that focus and direct a laser beam emitted from the laser source into a photonic platform;
   wherein the laser source and the plurality of optical components are mounted to a substrate and encapsulated via an encapsulant, and wherein at least one optical component of the plurality of optical components is fabricated from a material having a refractive index value that is higher than the refractive index value of the encapsulant;
   wherein the plurality of optical components comprise at least one micro-lens that focuses the laser beam and a micro-prism that directs the laser beam that is focused into the photonic platform into which the photonic subsystem is to be integrated;
   wherein the at least one micro-lens comprises a silicon micro-lens;
   wherein the silicon micro-lens is configured to have a radius of curvature of 390 µm;
   wherein the silicon micro-lens is configured to produce a laser spot beam having a major axis of 22.9 µm and a minor axes of 7.6 µm when a distance L2 between a bottom of the micro-prism and the photonic platform into which the photonic subsystem is to be integrated is 250 μm.

6. The hybrid integrated photonic system of claim 5, wherein the photonic device comprises a coupler grating designed to match dimensions of a laser spot it receives from the photonic subsystem.

7. A method for fabricating a photonic subsystem for integrating onto a photonic platform, the method comprising:
providing a laser source;
providing a plurality of optical components that focus and direct a laser beam emitted from the laser source into a photonic platform;
mounting the laser source and the plurality of optical components to a substrate; and
encapsulating the laser source and the plurality of optical components via an encapsulant, wherein at least one optical component of the plurality of optical components is fabricated from a material having a refractive index value that is higher than the refractive index value of the encapsulant;
wherein said encapsulating comprises pouring silicone over the laser source and the plurality of optical components.

8. The method of claim 7, further comprising pouring the silicone when it has a viscosity in a range of 5,000 to 50,000 CPS.

9. A photonic subsystem for integrating onto a photonic platform, the photonic subsystem comprising:
a laser source;
a plurality of optical components that focus and direct a laser beam emitted from the laser source into a photonic platform;
wherein the laser source and the plurality of optical components are mounted to a substrate and encapsulated via an encapsulant, and wherein at least one optical component of the plurality of optical components is fabricated from a material having a refractive index value that is higher than the refractive index value of the encapsulant;
wherein the plurality of optical components comprise at least one micro-lens that focuses the laser beam and a micro-prism that directs the laser beam that is focused into the photonic platform into which the photonic subsystem is to be integrated;
wherein the at least one micro-lens comprises a silicon micro-lens;
wherein the silicon micro-lens comprises an aspherical lens configured to have a radius of curvature of 700 μm,
wherein the silicon micro-lens is configured to produce a laser spot beam having a major axis of 26.8 μm and a minor axis of 9.7 μm when a distance L2 between a bottom of the micro-prism and the photonic platform into which the photonic subsystem is to be integrated is 250 μm.

10. A photonic subsystem for integrating onto a photonic platform, the photonic subsystem comprising:
a laser source;
a plurality of optical components that focus and direct a laser beam emitted from the laser source into a photonic platform;
wherein the laser source and the plurality of optical components are mounted to a substrate and encapsulated via an encapsulant, and wherein at least one optical component of the plurality of optical components is fabricated from a material having a refractive index value that is higher than the refractive index value of the encapsulant;
wherein the plurality of optical components comprise at least one micro-lens that focuses the laser beam and a micro-prism that directs the laser beam that is focused into the photonic platform into which the photonic subsystem is to be integrated;
wherein the at least one micro-lens comprises a micro-ball lens fabricated from a high-index glass;
wherein the high-index glass comprises a glass having a refractive index of 1.9743 when a wavelength of the laser source is 1550 nm.

11. The photonic subsystem of claim 10, wherein the micro-ball lens fabricated from the high-index glass is adapted to have a radius of curvature of 150 μm.

12. The photonic subsystem of claim 11, wherein the micro-ball lens fabricated from the high-index glass is configured to produce a laser spot beam having a major axis of 30.5 μm and a minor axes of 10.7 μm when a distance L2 between a bottom of the micro-prism and the photonic platform into which the photonic subsystem is to be integrated is 250 μm.

13. The photonic subsystem of claim 11, wherein the micro-ball lens fabricated from the high-index glass is configured to produce a laser spot beam having a major axis of 22.1 μm and a minor axes of 8.2 μm when a distance L2 between a bottom of the micro-prism and the photonic platform into which the photonic subsystem is to be integrated is 125 μm.

\* \* \* \* \*